US006420279B1

(12) United States Patent
Ono et al.

(10) Patent No.: US 6,420,279 B1
(45) Date of Patent: Jul. 16, 2002

(54) METHODS OF USING ATOMIC LAYER DEPOSITION TO DEPOSIT A HIGH DIELECTRIC CONSTANT MATERIAL ON A SUBSTRATE

(75) Inventors: Yoshi Ono, Camas; Wei-Wei Zhuang, Vancouver, both of WA (US); Rajendra Solanki, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/894,941

(22) Filed: Jun. 28, 2001

(51) Int. Cl.[7] ........................ H01L 21/31; H01L 21/469
(52) U.S. Cl. ........................................ 438/785; 438/758
(58) Field of Search ................................ 438/785, 685, 438/758

(56) References Cited

U.S. PATENT DOCUMENTS 6,200,893 B1 * 3/2001 Sneh .......................... 438/685
6,203,613 B1 * 3/2001 Gates et al. ................ 117/104
6,287,965 B1 * 9/2001 Kang et al. ................. 438/648
6,297,539 B1 * 10/2001 Ma et al.

OTHER PUBLICATIONS

Article entitled, "Ultrathin High–K DielectricS Grown by Atomic Layer Chemical Vapor Deposition, etc." by E. P. Gusev, et al., Electrochem. Society Meeting Abstracts #578, Mar. 2001.

Article entitled, "Tetranitratozironium(iv)—A New Volatile Complex" by B.O. Field et al., published in Proc. Chem. Soc. 1962, pp. 76–77.

Article entitled, "Chemical Vapour Deposition of the Oxides of Titanium, Zirconium and Hafnium for Use as High–k Materils in Microelectronic Devices. A Caron–free Precursor for the Synthesis of Hafnium Dioxide", by Smith et al., published in Advanced Materials for Optics and Electronics 10, pp. 105–114.

Article entitled, "High Permittivity Thin Film Nanolaminates" by H. Zhang et al., published in Journal of Applied Physics, vol. 87, No. 4, Feb. 15, 2000, pp. 1921–1924.

Abstract No. 583 entitled, "High Quality Ultra–Thin HFO2 Gate Stack Prepared by in–situ RT–MOCVD Process" by S.J. Lee et al., Electrochem. Society Meeting, Mar. 2001.

Abstract No. 575 entitled, "High–K Gate Dielectrics: ZrO2, and Their Silicates" by Jack C. Lee et al., Electrochem. Society Meeting, Mar. 2001.

* cited by examiner

*Primary Examiner*—Alexander G. Ghyka
(74) *Attorney, Agent, or Firm*—Matthew D. Rabdau; David C. Ripma; Scott C. Krieger

(57) ABSTRACT

Methods of forming hafnium oxide, zirconium oxide and nanolaminates of hafnium oxide and zirconium oxide are provided. These methods utilize atomic layer deposition techniques incorporating nitrate-based precursors, such as hafnium nitrate and zirconium nitrate. The use of these nitrate based precursors is well suited to forming high dielectric constant materials on hydrogen passivated silicon surfaces.

19 Claims, 2 Drawing Sheets

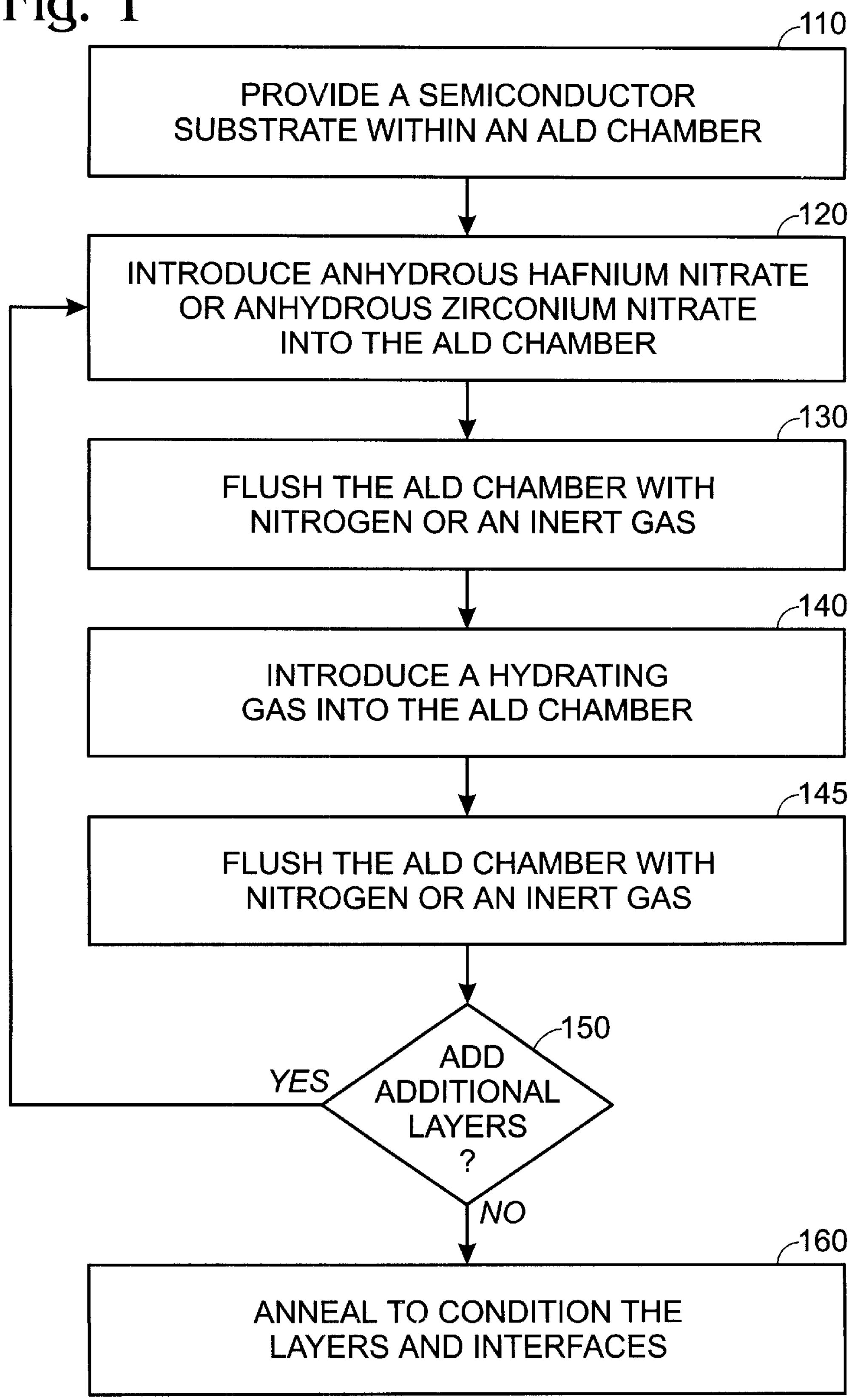
Fig. 1
110
PROVIDE A SEMICONDUCTOR SUBSTRATE WITHIN AN ALD CHAMBER
120
INTRODUCE ANHYDROUS HAFNIUM NITRATE OR ANHYDROUS ZIRCONIUM NITRATE INTO THE ALD CHAMBER
130
FLUSH THE ALD CHAMBER WITH NITROGEN OR AN INERT GAS
140
INTRODUCE A HYDRATING GAS INTO THE ALD CHAMBER
145
FLUSH THE ALD CHAMBER WITH NITROGEN OR AN INERT GAS
150
ADD ADDITIONAL LAYERS ?
YES
NO
160
ANNEAL TO CONDITION THE LAYERS AND INTERFACES

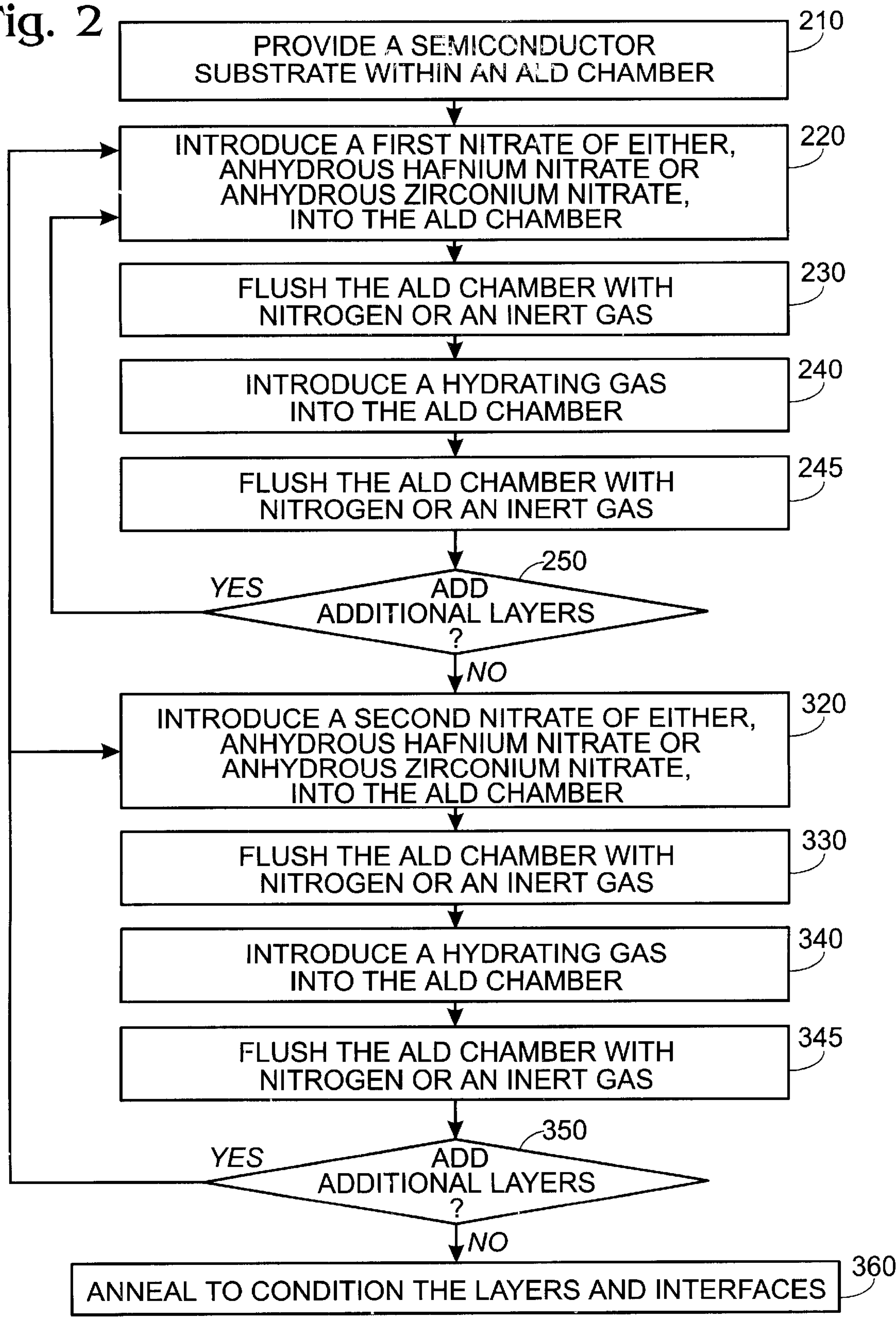
Fig. 2
PROVIDE A SEMICONDUCTOR SUBSTRATE WITHIN AN ALD CHAMBER
210
INTRODUCE A FIRST NITRATE OF EITHER, ANHYDROUS HAFNIUM NITRATE OR ANHYDROUS ZIRCONIUM NITRATE, INTO THE ALD CHAMBER
220
FLUSH THE ALD CHAMBER WITH NITROGEN OR AN INERT GAS
230
INTRODUCE A HYDRATING GAS INTO THE ALD CHAMBER
240
FLUSH THE ALD CHAMBER WITH NITROGEN OR AN INERT GAS
245
ADD ADDITIONAL LAYERS ?
250
YES
NO
INTRODUCE A SECOND NITRATE OF EITHER, ANHYDROUS HAFNIUM NITRATE OR ANHYDROUS ZIRCONIUM NITRATE, INTO THE ALD CHAMBER
320
FLUSH THE ALD CHAMBER WITH NITROGEN OR AN INERT GAS
330
INTRODUCE A HYDRATING GAS INTO THE ALD CHAMBER
340
FLUSH THE ALD CHAMBER WITH NITROGEN OR AN INERT GAS
345
ADD ADDITIONAL LAYERS ?
350
YES
NO
ANNEAL TO CONDITION THE LAYERS AND INTERFACES
360

METHODS OF USING ATOMIC LAYER DEPOSITION TO DEPOSIT A HIGH DIELECTRIC CONSTANT MATERIAL ON A SUBSTRATE

BACKGROUND OF THE INVENTION

The present invention relates generally to integrated circuit (IC) fabrication processes and, more particularly, to methods of forming high dielectric constant materials on silicon.

Current Si VLSI technology uses $SiO_2$ as the gate dielectric in MOS devices. As device dimensions continue to scale down, the thickness of the $SiO_2$ layer must also decrease to maintain the same capacitance between the gate and channel regions. Thicknesses of less than 2 nanometers (nm) are expected in the future. However, the occurrence of high tunneling current through such thin layers of $SiO_2$ requires that alternate materials be considered. Materials with high dielectric constants would permit gate dielectric layers to be made thicker, and so alleviate the tunneling current problem. These so-called high-k dielectric films are defined herein as having a high dielectric constant relative to silicon dioxide. Typically, silicon dioxide has a dielectric constant of approximately 4, while it would be desirable to use a gate dielectric material with a dielectric constant of greater than approximately 10.

Because of high direct tunneling currents, $SiO_2$ films thinner than 1.5 nm generally cannot be used as the gate dielectric in CMOS devices. There are currently intense efforts in the search for the replacement of $SiO_2$, with $TiO_2$ and $Ta_2O_5$ attracting the greatest attention. However, high temperature post deposition annealing, and the formation of an interfacial $SiO_2$ layer, make achieving equivalent $SiO_2$ thicknesses, also known as equivalent oxide thickness (EOT), of less than 1.5 nm very difficult. An EOT of about 1.0 nm, and below, is expected to be used for the 0.07 micrometer device generation.

Materials such as hafnium oxide ($HfO_2$) and zirconium oxide ($ZrO_2$) are leading candidates for high-k dielectric materials. The dielectric constant of these materials is about 20 to 25, which is a factor of 5–6 times that of silicon dioxide, meaning that a thickness of about 5–6 nm of these materials could be used to achieve an EOT of about 1.0 nm, assuming that the entire film is essentially composed of the high-k material. One problem with using high-k materials is that an interfacial layer of silicon dioxide, or a silicate layer, with a lower dielectric constant forms during standard processing.

Deposition of $ZrO_2$, or $HfO_2$, using atomic layer deposition (ALD) and tetrachloride precursors has been reported. Substrates heated to between 300° C. and 400° C. have been exposed to $ZrCl_4$, or $HfCl_4$, precursors alternating with water vapor in an attempt to form $ZrO_2$ or $HfO_2$ films respectively. However, it is difficult to initiate deposition on hydrogen terminated silicon surfaces. Hydrogen terminated silicon surfaces result from standard industry cleaning processes. These standard cleaning processes, which are often referred to as HF last clean, typically end in a quick dip of HF. This produces surfaces which are hydrogen terminated, also known as hydrogen passivated. With sufficient exposure of the silicon surface to the reactants, the deposition may eventually be initiated. But, this results in films that are rough with poor uniformity. Another problem with tetrachloride precursors is the incorporation of residual chlorine in the film. The chlorine impurities can result in long term reliability and performance issues.

Other precursors use Hf or Zr metal combined with organic ligands such as iso-propoxide, TMHD (2,2,6,6-tetrmethyl-3,5-heptanedionate), or combinations of organic ligands with chlorine. These precursors also have a problem initiating the film deposition on hydrogen terminated silicon surfaces and will incorporate carbon residues in the film. Large ligands may also take up enough space that steric hindrance will prevent the deposition of a uniform monolayer. Up until now, the successful implementation of ALD Zr and Hf oxides have been either on an initial layer of silicon oxide, silicon oxynitride, or in the form of a reduced dielectric constant silicate film, such as $ZrSiO_4$ or $HfSiO_4$. These initial layers may contribute significantly to the overall EOT.

SUMMARY OF THE INVENTION

Accordingly, a method of forming high dielectric constant materials, $ZrO_2$ or $HfO_2$, is provided. The methods are well suited to forming high dielectric constant materials on hydrogen terminated silicon surfaces, however the methods can be also used to form these materials on a variety of substrates.

A method is provided for forming zirconium oxide on a substrate comprises providing a semiconductor substrate within an atomic layer deposition chamber. Heating the substrate to a temperature within the atomic layer deposition regime. Introducing anhydrous zirconium nitrate into the chamber. Purging the chamber with nitrogen. And, introducing water vapor into the chamber, whereby a monolayer of zirconium oxide is deposited. The steps of introducing of anhydrous zirconium nitrate, purging the chamber with nitrogen, and introducing water vapor may each be repeated as necessary to produce a zirconium oxide film of the desired thickness.

A method is provided for forming hafnium oxide on a substrate comprises providing a semiconductor substrate within an atomic layer deposition chamber. Heating the substrate to a temperature within the atomic layer deposition regime. Introducing anhydrous hafnium nitrate into the chamber. Purging the chamber with nitrogen. And, introducing water vapor into the chamber, whereby a monolayer of hafnium oxide is deposited. The steps of introducing of anhydrous hafnium nitrate, purging the chamber with nitrogen, and introducing water vapor may each be repeated as necessary to produce a hafnium oxide film of the desired thickness.

A method is provided for forming a nanolaminate, which comprises hafnium oxide and zirconium oxide. The method comprises repeating the steps mentioned above with regard to forming zirconium oxide, and repeating the steps mentioned above with regard to forming hafnium oxide, and alternating these steps as desired to produce a nanolaminate, such as $HfO_2/ZrO_2/HfO_2/ZrO_2$.

BRIEF DESCRIPTION OF THE DRAWINGS

FIG. 1 is a flow chart of a process for depositing $HfO_2$ or $ZrO_2$.

FIG. 2 is a flow chart of a process for depositing a nanolaminate of $HfO_2$ and $ZrO_2$.

DETAILED DESCRIPTION OF THE INVENTION

FIG. 1 shows a flow chart illustrating the steps of a process of depositing a film of $HfO_2$ or $ZrO_2$. Step 110 provides a semiconductor substrate within an ALD chamber.

Commercial ALD tools are now becoming available. Microchemistry. Ltd of Finland (now a division of ASM) manufactures an ALD tool, Model F120, that may be used in connection with the process described herein. In a preferred embodiment, the semiconductor substrate has a silicon surface that is hydrogen terminated. Although the process described herein is well suited to solving the problem of depositing $HfO_2$ or $ZrO_2$ on hydrogen terminated silicon surfaces, it is entirely possible to use this process to deposit $HfO_2$ or $ZrO_2$ on other surface including, silicon dioxide, silicon oxynitride, silicon germanium, and on silicates, such as $ZrSiO_4$ and $HfSiO_4$.

The semiconductor substrate is heated to a temperature for an atomic layer deposition regime. For example, a hydrogen passivated silicon surface was found to be within the atomic layer deposition regime when using anhydrous hafnium nitrate at temperature of approximately 160 to 200° C.

Step 120 introduces anhydrous hafnium nitrate ($Hf(NO_3)_4$), or anhydrous zirconium nitrate ($Zr(NO_3)_4$) into the ALD chamber. The hafnium nitrate, or zirconium nitrate, adsorbs onto the semiconductor substrate surface, even if the substrate surface is hydrogen terminated silicon.

Although anhydrous hafnium nitrate and anhydrous zirconium nitrate are not currently commercially available, synthesis and purification techniques for these materials are known. Synthesis of zirconium nitrate was reported in 1962. Due to the similarities between hafnium and zirconium, hafnium nitrate may also be isolated through a similar synthesis process. Hafnium nitrate may be prepared by refluxing hafnium tetrachloride over dinitrogen pentoxide at 30° C., and then purified by sublimation at 100° C./0.1 mmHg for hafnium nitrate. Zirconium nitrate can be similarly purified at 95° C./0.1 mmHg.

Step 130 purges the ALD chamber with nitrogen or an inert gas, such as argon, helium or neon, to reduce, or eliminate, any excess anhydrous hafnium nitrate, or anhydrous zirconium nitrate, or undesirable reactants.

Step 140 introduces a hydrating gas into the ALD chamber. The hydrating gas provides hydrogen to facilitate removal of nitrogen, including nitrates and nitrogen dioxide. The hydrating gas assists in removing $NO_3$ ligands, either in the form of $NO_3$, or as $NO_2$ with oxygen atom being used to form a hafnium oxide, or zirconium oxide, film. The hydrating gas may be water vapor, methanol or hydrogen. The exact chemical mechanism is not fully understood, and does not limit the scope of any claim.

Step 145 purges the ALD chamber with nitrogen, or an inert gas, to reduce, or eliminate, the hydrating gas and possible undesired reactants within the chamber.

Step 150 illustrates the repetition of steps 120, 130 140 and 145 to produce a film of the desired thickness. The ALD process is inherently growth rate limited by the number of cycles of alternate exposure to the nitrate, hafnium nitrate or zirconium nitrate, and hydrating gas, with appropriate purging. Step 160 anneals the film to condition the film following completion of the desired number of cycles.

For example, a hafnium oxide film was formed on a silicon substrate with a hydrogen terminated silicon surface by placing the substrate into the ALD chamber at 10 millitorr and heating the substrate to approximately 180° C. The substrate was processed using multiple ALD cycles. Each ALD cycle comprised introducing anhydrous hafnium nitrate, purging with nitrogen and introducing water vapor. Samples were produced using approximately 7 cycles, 13 cycles, 17 cycles and 400 cycles.

The thickness of each sample was measured using a spectroscopic ellipsometer. The 400-cycle sample had a measure thickness of 128.1 nm, which corresponds to a deposition rate of approximately 3.2 Å/cycle. On the thinner sample, the deposition rate was 3.6 Å/cycle. Considering that the bulk density of hafnium oxide is listed at 9.68 $g/cm^3$, the volume of one molecule is 36.1 Å, one monolayer would be expected to be approximately 3.3 Å thick. Accordingly, a deposition rate of between 3.2 Å/cycle and 3.6 Å/cycle corresponds well to a deposition of one monolayer per cycle. It was also determined that the deposition rate is temperature sensitive. Samples run at 170° C. resulted in a deposition rate of 2.8 Å/cycle.

Referring now to FIG. 2, a flow chart is shown for producing a nanolaminate, or layered film, comprising layers of hafnium oxide and zirconium oxide. Step 210 provides a semiconductor substrate within an ALD chamber. The semiconductor substrate is heated to a temperature for an atomic layer deposition regime.

Step 220 introduces either anhydrous hafnium nitrate ($Hf(NO_3)_4$), or anhydrous zirconium nitrate ($Zr(NO_3)_4$) into the ALD chamber. Either the hafnium nitrate, or zirconium nitrate, whichever is introduced in this step 220 adsorbs onto the semiconductor substrate surface.

Step 230 purges the ALD chamber with nitrogen or an inert gas to reduce, or eliminate, any excess anhydrous hafnium nitrate, or anhydrous zirconium nitrate, or undesirable reactants.

Step 240 introduces a hydrating gas into the ALD chamber. The hydrating gas assists in removing $NO_3$ ligands, either in the form of $NO_3$, or as $NO_2$ with oxygen atom being used to form a hafnium oxide film, or zirconium oxide film.

Step 245 purges the ALD chamber with nitrogen or inert gas to reduce, or eliminate, the hydrating gas and possible undesired reactants within the chamber.

Step 250 illustrates the repetition of steps 220, 230 240 and 245 to produce a layer of material, either hafnium oxide or zirconium oxide, of a desired thickness of the first nitrate. The ALD process is inherently growth rate limited by the number of cycles of alternate exposure to the nitrate, hafnium nitrate or zirconium nitrate, and hydrating gas, with appropriate purging. By repeating through the cycles indicated by step 250 the desired thickness of each layer of material, either hafnium oxide, or zirconium oxide, can be formed.

Step 320 introduces which ever of anhydrous hafnium nitrate ($Hf(NO_3)_4$), or anhydrous zirconium nitrate ($Zr(NO_3)_4$) that was not introduced in step 220 into the ALD chamber. Either the hafnium nitrate, or the zirconium nitrate, whichever is introduced in this step 320 adsorbs onto the semiconductor substrate surface.

Step 330 purges the ALD chamber with nitrogen or an inert gas to reduce, or eliminate, any excess anhydrous hafnium nitrate, or anhydrous zirconium nitrate, or undesirable reactants.

Step 340 introduces hydrating gas into the ALD chamber. The hydrating gas assists in removing $NO_3$ ligands, either in the form of $NO_3$, or as $NO_2$ with oxygen atom being used to form either a film of hafnium oxide, or a film of zirconium oxide, whichever was not formed in step 240.

Step 345 purges the ALD chamber with nitrogen or inert gas to reduce, or eliminate, the hydrating gas and possible undesired reactants within the chamber.

Step 350 illustrates the repetition of steps 320, 330 340 and 345 to produce a layer of material, either hafnium oxide or zirconium oxide, of the desired thickness. In addition, step 350 illustrates the repetition of steps starting again at 220. This allows a film having multiple alternating layers to be formed for example $HfO_2/ZrO_2/HfO_2/ZrO_2$ or $ZrO_2/HfO_2/ZrO_2/HfO_2/ZrO_2$ with the thickness of each individual layer being separately determined, as well as the overall thickness.

Step 360 anneals the film to condition the film and any interfaces between the layers of materials following completion of the desired number of cycles, and sub-cycles.

What is claimed is:

1. A method of forming a high-k dielectric film on a substrate comprising the steps of:

a) providing a hydrogen passivated silicon surface on the semiconductor substrate within an atomic layer deposition chamber;

b) heating the substrate to a temperature below 200° C.;

c) introducing anhydrous hafnium nitrate into the chamber;

d) purging the chamber with nitrogen or inert gas; and e) introducing a hydrating gas into the chamber, whereby a monolayer of hafnium oxide is deposited.

2. The method of claim 1, wherein the hydrating gas is water vapor, methanol or hydrogen.

3. The method of claim 1, wherein the substrate is heated to a temperature in the range of between 160 and 200° C.

4. The method of claim 1, further comprising repeating the steps of introducing anhydrous hafnium nitrate into the chamber, purging the chamber, and introducing the hydrating gas into the chamber.

5. The method of claim 4, wherein the indicated steps are repeated until a hafnium oxide film with an equivalent oxide thickness of less than 20 angstroms is achieved.

6. A method of forming a high-k dielectric film on a substrate comprising the steps of:

a) providing a hydrogen passivated silicon surface on the semiconductor substrate within an atomic layer deposition chamber;

b) heating the substrate to a temperature below 200° C.;

c) introducing anhydrous zirconium nitrate into the chamber;

d) purging the chamber with nitrogen; and e) introducing a hydrating gas into the chamber, whereby a monolayer of zirconium oxide is deposited.

7. The method of claim 6, wherein the hydrating gas is water vapor, methanol or hydrogen.

8. The method of claim 6, wherein the substrate is heated to a temperature in the range of between 160 and 200° C.

9. The method of claim 6, further comprising repeating the steps of introducing anhydrous zirconium nitrate into the chamber, purging the chamber, and introducing the hydrating gas into the chamber.

10. The method of claim 9, wherein the indicated steps are repeated until a zirconium oxide film with an equivalent oxide thickness of less than 20 angstroms is achieved.

11. A method of forming a nanolaminate, which comprises hafnium oxide and zirconium oxide, comprising the steps of:

a) providing a semiconductor substrate having a hydrogen passivated silicon surface within an atomic layer deposition chamber;

b) heating the substrate to a temperature below 200° C.;

c) forming a layer of hafnium oxide by a process comprising the steps of:

(i) introducing anhydrous hafnium nitrate into the chamber;

(ii) purging the chamber;

(iii) introducing a hydrating gas into the chamber, whereby a monolayer of hafnium oxide is formed;

(iv) purging the chamber; and d) forming a layer of zirconium oxide by a process comprising the step of:

(i) introducing anhydrous zirconium nitrate into the chamber;

(ii) purging the chamber; and (iii) introducing a hydrating gas into the chamber, whereby a monolayer of zirconium oxide is formed; and (iv) purging the chamber.

12. The method of claim 11, further comprising repeating the step of c) forming the layer of hafnium oxide until a desired thickness is reached.

13.The method of claim 11, further comprising repeating the step of d) forming the layer of zirconium oxide until a desired thickness is reached.

14. The method of claim 11, further comprising repeating the steps of c) forming the layer of hafnium oxide and d) forming the layer of zirconium oxide, whereby the nanolaminate of a desired total thickness is formed.

15. The method of claim 3, wherein the substrate is heated to a temperature of approximately 170° C.

16. The method of claim 3, wherein the substrate is heated to a temperature of approximately 180° C.

17. The method of claim 8, wherein the substrate is heated to a temperature of approximately 170° C.

18. The method of claim 8, wherein the substrate is heated to a temperature of approximately 180° C.

19. The method of claim 11, wherein the substrate is heated to a temperature of between 160 and 200° C.

* * * * *